United States Patent [19]
Botka et al.

[11] Patent Number: 5,923,180
[45] Date of Patent: Jul. 13, 1999

[54] COMPLIANT WAFER PROBER DOCKING ADAPTER

[75] Inventors: Julius K. Botka; David R. Veteran, both of Santa Rosa, Calif.

[73] Assignee: Hewlett-Packard Company, Palo Alto, Calif.

[21] Appl. No.: 08/794,821

[22] Filed: Feb. 4, 1997

[51] Int. Cl.[6] .................................................. G01R 31/02
[52] U.S. Cl. .......................................... 324/758; 324/765
[58] Field of Search .................................... 324/754, 755, 324/158.1, 757, 758, 765

[56] References Cited

U.S. PATENT DOCUMENTS

| | | | |
|---|---|---|---|
| 4,893,074 | 1/1990 | Holt | 324/158.1 |
| 5,068,601 | 11/1991 | Pamenter | 324/758 |
| 5,550,466 | 8/1996 | Botka | 324/158.1 |
| 5,552,701 | 9/1996 | Botka et al. | 324/158.1 |
| 5,606,262 | 2/1997 | Montalbano | 324/758 |
| 5,663,653 | 9/1997 | Schwindt | 324/758 |
| 5,677,636 | 10/1997 | Slocum | 324/758 |
| 5,828,225 | 10/1998 | Obikane | 324/758 |

*Primary Examiner*—Jose Ballato
*Assistant Examiner*—Thomas Valone

[57] ABSTRACT

A compliant wafer prober docking adapter provide compliant docking capability which permits a test head to be floated (to come down) to the top portion of the compliant adapter. The compliant adapter includes a compliant spring mechanism in the form of coiled springs which support a portion of the weight of the test head and wherein the upper portion of the adapter automatically aligns itself with the test head. This desirable aspect allows for all of the connectors to be seated properly, such that the locking of a cam locking mechanism provides a compliant and secure mating between the two surfaces. Also, a test head can be easily moved from one wafer prober to another, because the alignment of the adapter to the wafer is not being disturbed. Hence, the head can be moved between stations very quickly without having to go through another long and complex re-alignment process

11 Claims, 13 Drawing Sheets

COMPLIANT WAFER PROBER DOCKING ADAPTER

CROSS REFERENCE TO RELATED APPLICATIONS

The present application is related to patent application entitled Docking System For An Electronic Circuit Tester, filed May 15, 1996, Ser. No. 441,563, and now U.S. Pat. No. 5,552,701, issued Sep. 3, 1996, and which is assigned to the same assignee as the present application.

BACKGROUND OF THE INVENTION

The present invention relates to a compliant wafer prober docking adapter for use in a docking system for accurately aligning an electronic test head to a wafer prober. Such docking systems are described, for example, in the above identified U.S. Pat. No. 5,552,701, the details of which are hereby incorporated by reference.

Prior art wafer probers and test heads are rigid devices, which can make it difficult to achieve a precise alignment between the test head and the wafer prober. For alignment purposes, the surface of the test head (tester) should be planar to the surface of the wafer prober (wafer). The test head and wafer prober both have large masses, which makes it extremely difficult to quickly align their respective planes to one another. It would be very desirable to mate the two surfaces accurately and quickly. The prior art approaches have difficulty in achieving this capability because of the rigidity and large masses involved. In addition, damage to one and/or another of the surfaces can occur when trying to have one massive planar surface mate with another.

In the prior art, in order to speed up the mating of the test system to the wafer prober, an adapter is rigidly affixed to the test head itself such that the test head is moved down upon the wafer. The probe tips are aligned to the wafer by moving the test head (a large mass) around while looking through a periscope through the middle of the test head. In such an awkward process, it frequently takes two persons working together for a long period of time to coordinate on properly aligning the two large masses, where one person views from the bottom of the locking mechanism which is to be engaged so as to hold the head in a locked position and the other person (usually on a ladder) views how the probes are aligned to the wafer.

In view of the foregoing, it would be very desirable to provide an improved wafer prober docking adapter for use in docking systems for accurately and quickly aligning an electronic test set to a wafer prober.

SUMMARY OF THE INVENTION

It is an object of the present invention to provide a compliant wafer prober docking adapter for use in accurately and quickly aligning an electronic test set to a wafer prober.

In one embodiment, the compliant wafer prober docking adapter provides a compliant docking capability. The compliant adapter includes a compliant spring mechanism in the form of coiled springs which support a portion of the weight of a test head wherein the upper portion of the adapter automatically aligns itself with the test head. This desirable aspect allows for all of the connectors to be seated properly, such that the locking engagement provides a compliant and secure mating between the two surfaces, even though the surfaces of the wafer prober and the test head are not perfectly planar.

Another feature of the present invention is in connection with the docking process. As previously described above, in the prior art, in order to speed up the mating of the test system to the wafer prober, an adapter is rigidly affixed to the test head such that the test head is moved down upon the wafer and the probe tips are aligned to the wafer by moving the test head (a large mass) around while looking through a periscope through the middle of the test head. Using this process, it frequently takes two persons working together to coordinate on properly aligning the two large masses.

The present invention provides for affixing the compliant adapter with an rotational ("theta") adjustment capability which allows for angular alignment of prober tips to a wafer prober (in one embodiment, an angular adjustment within approximately 15 degrees). The present invention allows for one user who can view the alignment process through a television monitor (or microscope) or directly without the complexity and awkwardness of prior art approaches. The head can then be lowered and locked in position and the system is ready to be tested.

In accordance with another feature of the present invention, a test head can be easily moved from one wafer prober to another, because the alignment of the adapter to the wafer prober is not being disturbed. Hence, the test head can be moved back and forth between stations very quickly without having to go through another long and complex re-alignment process.

Other objects, features and advantages of the present invention will become apparent from the following detailed description when taken in conjunction with the accompanying drawings.

BRIEF DESCRIPTION OF THE DRAWINGS

The accompanying drawings, which are incorporated in and form a part of this specification, illustrate preferred embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Before describing in detail the preferred embodiments of the present invention, it is believed helpful to provide a general overview of the docking system described in the above cross referenced U.S. Pat. No. 5,552,701.

Figure 1:
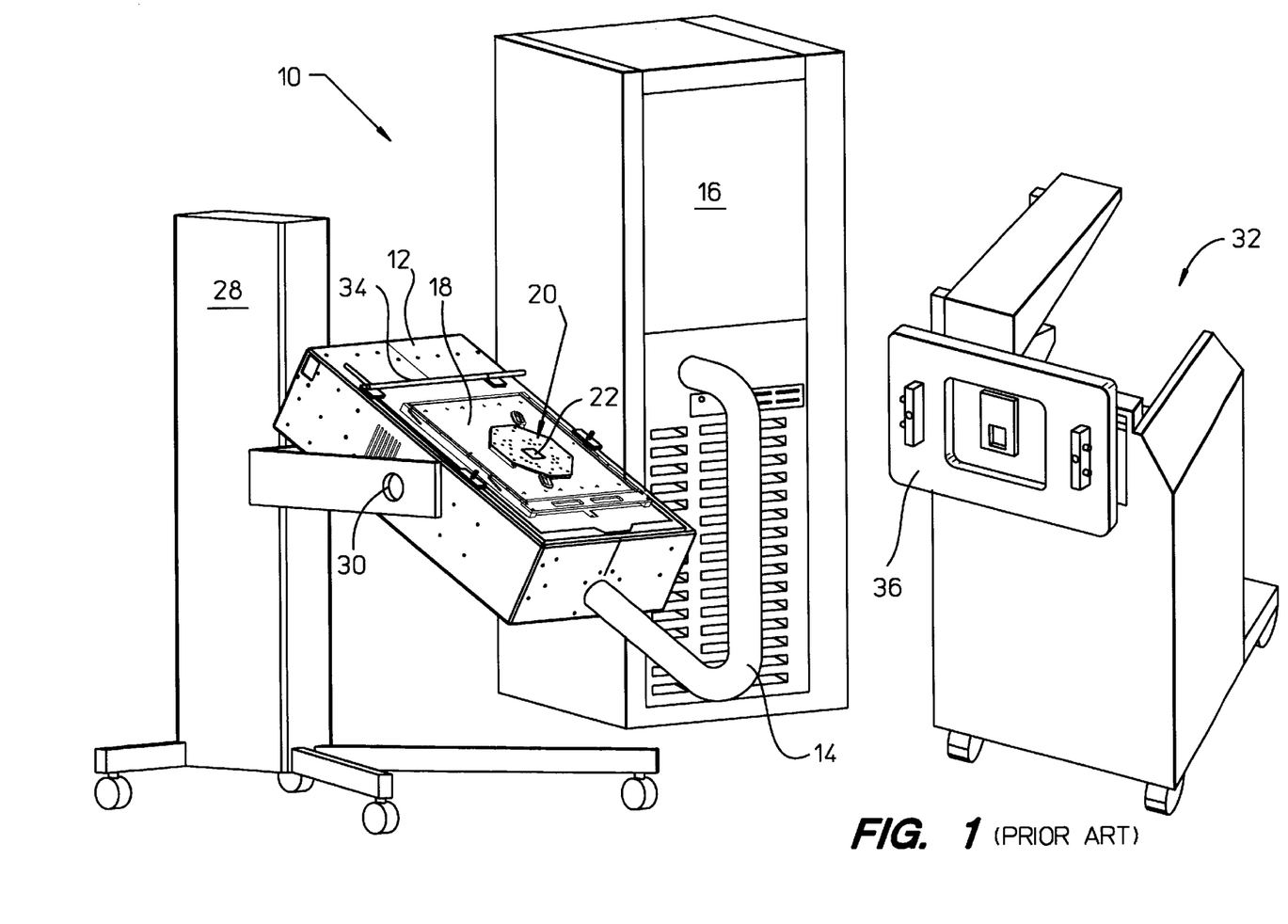
FIG. 1 is an isometric view of a conventional electronic circuit tester.
Figure 1A:
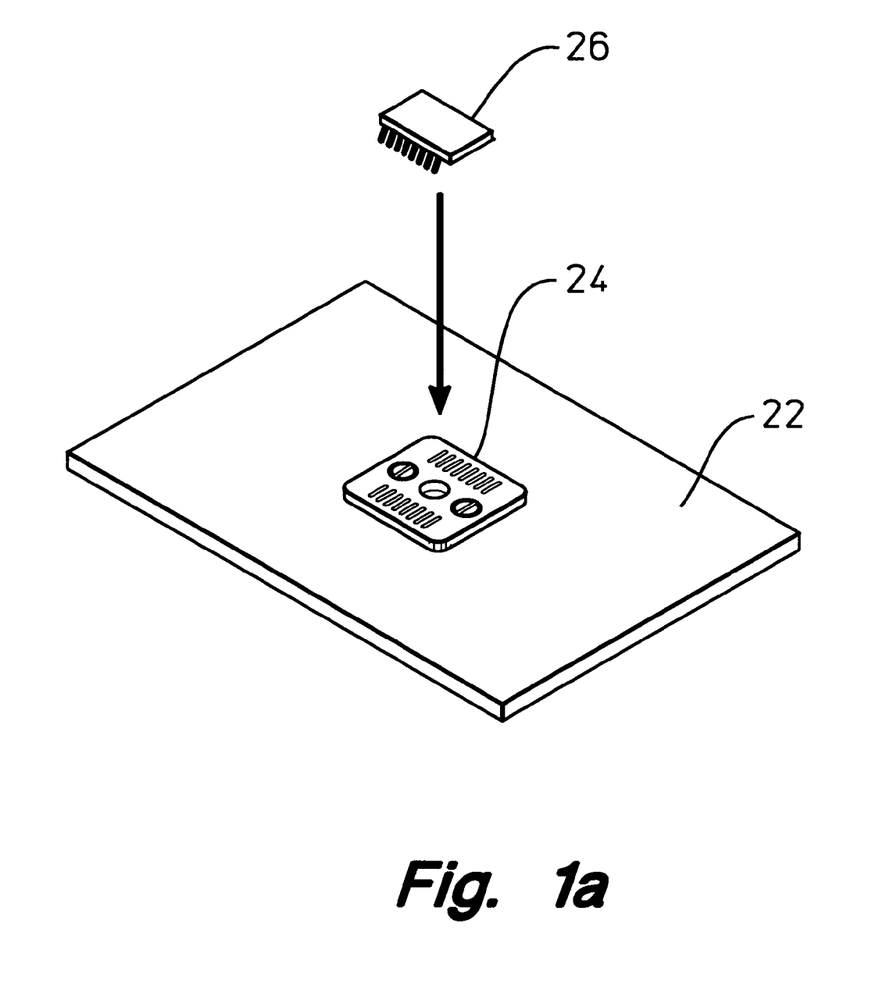
FIG. 1a is an isometric view of a device-under-test (DUT) board, which forms a portion of the tester of FIG. 1.

A conventional programmable electronic circuit tester, generally indicated by the numeral 10, is shown in FIG. 1. The electronic circuit tester 10 includes a test head 12 electrically connected by cables routed through a conduit 14 to a rack(s) 16 of electronic test and measurement instruments, such as ac and dc electrical signal generators for applying electrical signals to a device or integrated circuit interfaced to the test head, and signal analyzers, for example, a network analyzer, spectrum analyzer, oscilloscope, or other waveform digitizing and/or signal processing equipment, for measuring the response(s) to those applied electrical signals. The test head 12 can include circuitry which performs distribution of electrical signals, signal separation, frequency translation, amplification, attenuation, switching, or other conditioning or modification of electrical signals prior to being routed to the rack 16 or to a device or integrated circuit being tested.

Figure 2:
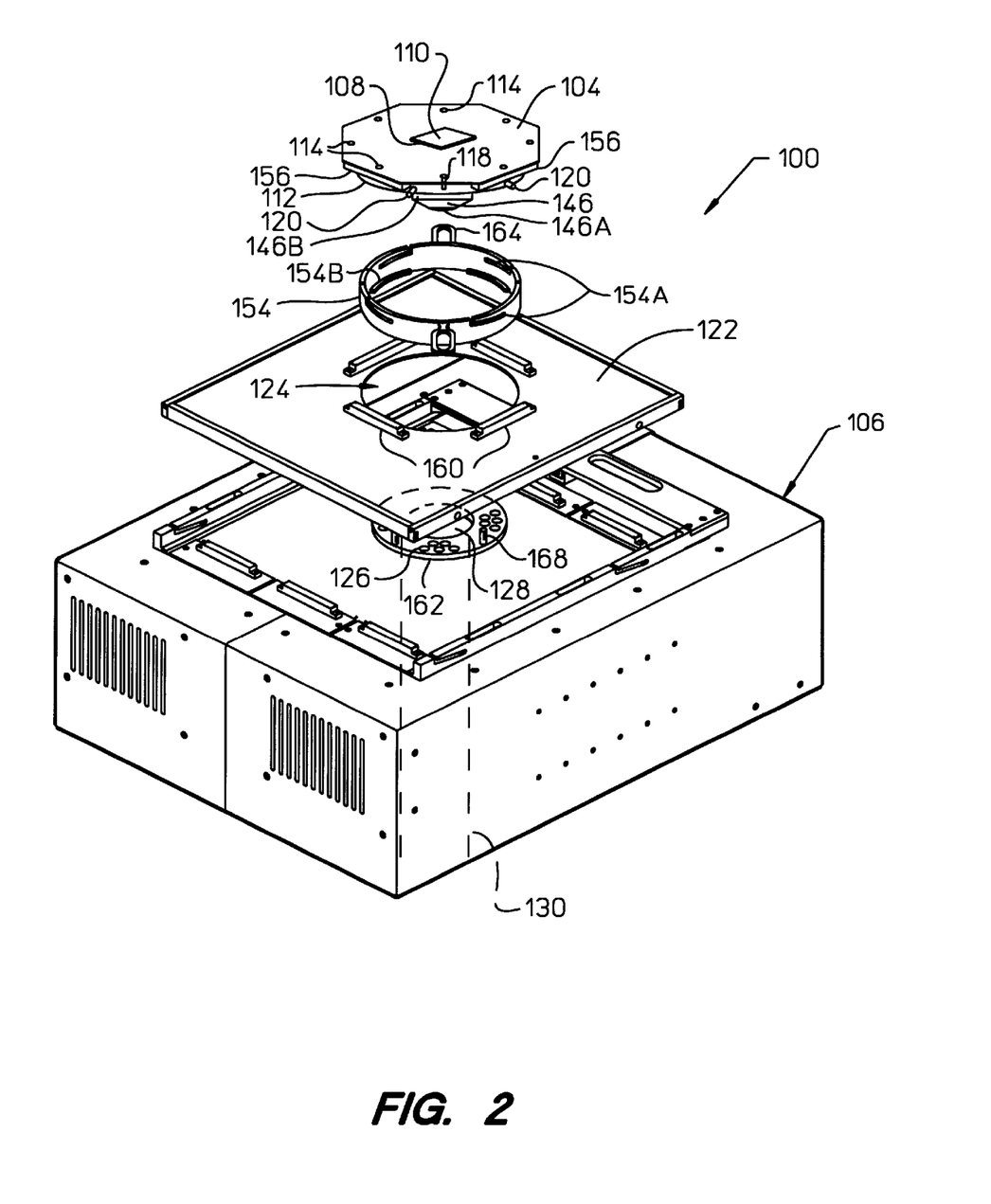
FIG. 2 is an exploded view of a test head, load board, and fixture board of an electronic circuit test system, which incorporate a docking system.

As shown in FIGS. 1 and 2a, the test head 12 interfaces to a device or integrated circuit through a load board 18 and in turn through a fixture board 20 typically mounted to the test head. Alternatively, prior to installation of the fixture board 20, a calibration board (not shown) having a configuration similar to the fixture board can be connected to the test head 12 for calibrating the test head. The configuration of the load board 18 depends on the type or family of device or integrated circuit being tested, such as an analog or digital electronic circuit, while the configuration of the fixture board 20 is typically specific to the family or particular device or integrated circuit being tested.

As shown in FIG. 1, the fixture board 20 is in turn interfaces to a device-under-test (DUT) board 22 that comprises inductors, capacitors, and/or other electronic components or circuits mounted to or fabricated on the components or circuits mounted to or fabricated on the DUT board for decoupling, filtering, attenuating, or otherwise modifying electrical signals transmitted to and/or received from a device or integrated circuit being tested. Finally, the DUT board 22 is connected to a socket 24 for effecting an electrical connection(s) between the electronic circuit tester 10 and the actual electronic circuit being tested, such as a packaged device or integrated circuit 26.

As also shown in FIG. 1, the test head 12 is mounted to a dolly 28. The test head 12 is mounted by pivotable connections 30 to dolly 28. The pivotable connections 30 enable the test head 12 to be positioned in an approximately upward facing horizontal position so that the appropriate load board 18 and calibration or fixture board 20 and DUT board with the socket 24 can be mounted to the test head of the electronic circuit tester 10 by an operator. The test head 12 can also be pivoted to any angular position so that the socket 24 can interface with an automated material handler 32, for example, which rapidly feeds each packaged device or integrated circuit 26 to the electronic circuit tester 10 to be tested.

Alternatively, a wafer probe (not shown) can be substituted for the socket 24 mounted to the DUT board 22. The pivotable connections 30 enable the test head 12 to be pivoted to an inverted position to test devices or integrated circuits on a wafer (not shown) at a wafer probing station (not shown).

In order to interface the socket 24 to the automated material handler 32, or a wafer probe (not shown) at a wafer probing station (not shown), a frame 34 is mounted to the test head 12. A jig 36 that mates with the frame 34 is mounted to the automated material handler 32 or wafer probing station (not shown) to align the test head 12 with the handler or station so that the socket 24 or a wafer probe (not shown), respectively, contacts the device or integrated circuit to be tested.

Unfortunately, the test head 12 is typically massive and difficult for the operator to manipulate. Therefore, it is problematic for the operator to align the socket 24 with respect to the automated material handler 32 or a wafer probing station (not shown) so that packaged devices or integrated circuits or devices or integrated circuits on wafer can be tested.

A structure is provide to facilitate alignment of the socket 24 with the automated material handler 32 or facilitate alignment of a wafer probe (not shown) at a wafer probing station (not shown). The structure facilitates setup and improve the repeatability and reliability of contact between the electronic circuit tester 10 and a device or integrated circuit during actual testing.

Figure 6:
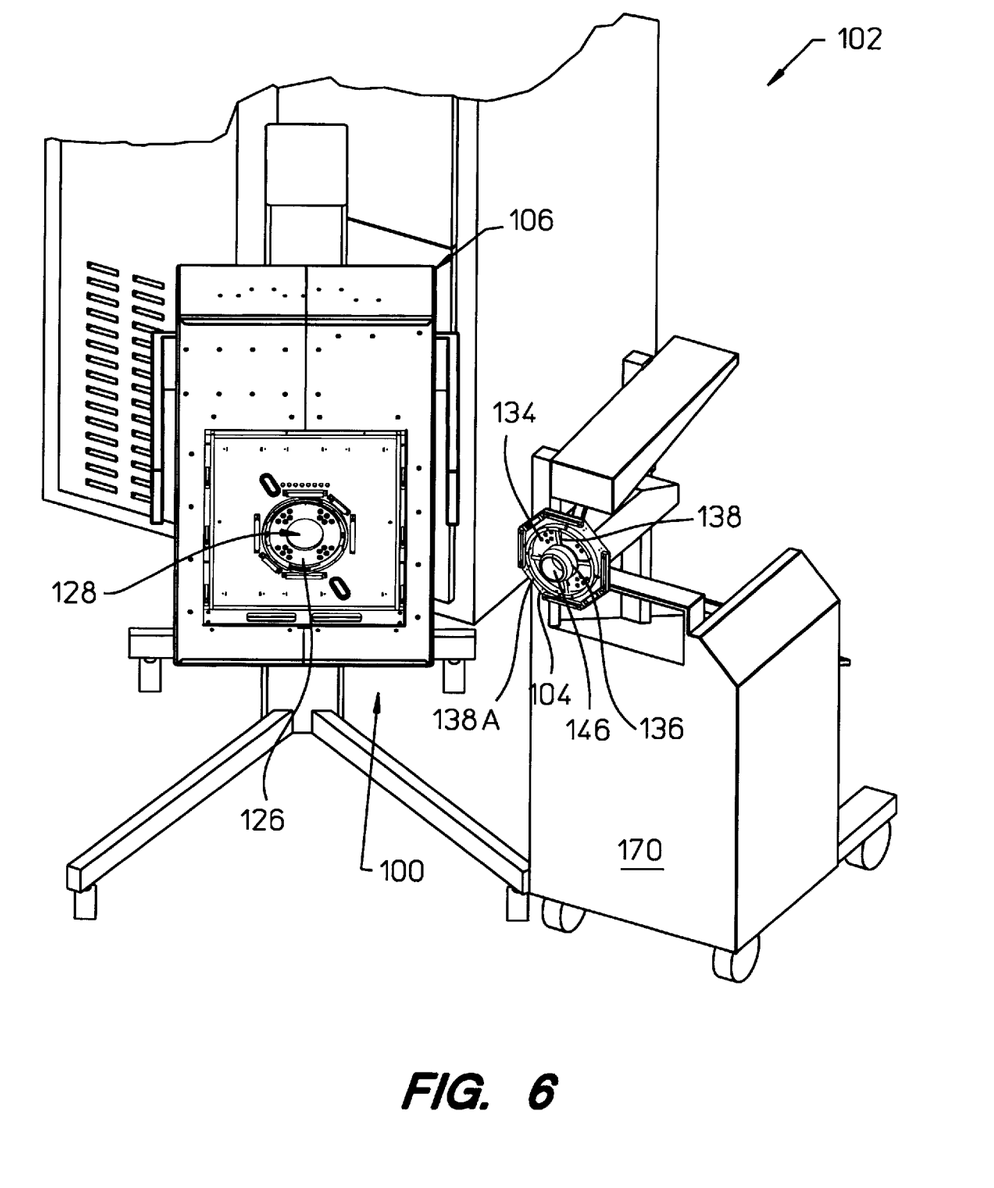
FIG. 6 illustrates deployment of the docking system to tester for packaged devices or integrated circuits fed by an automated material handler.
Figure 7:
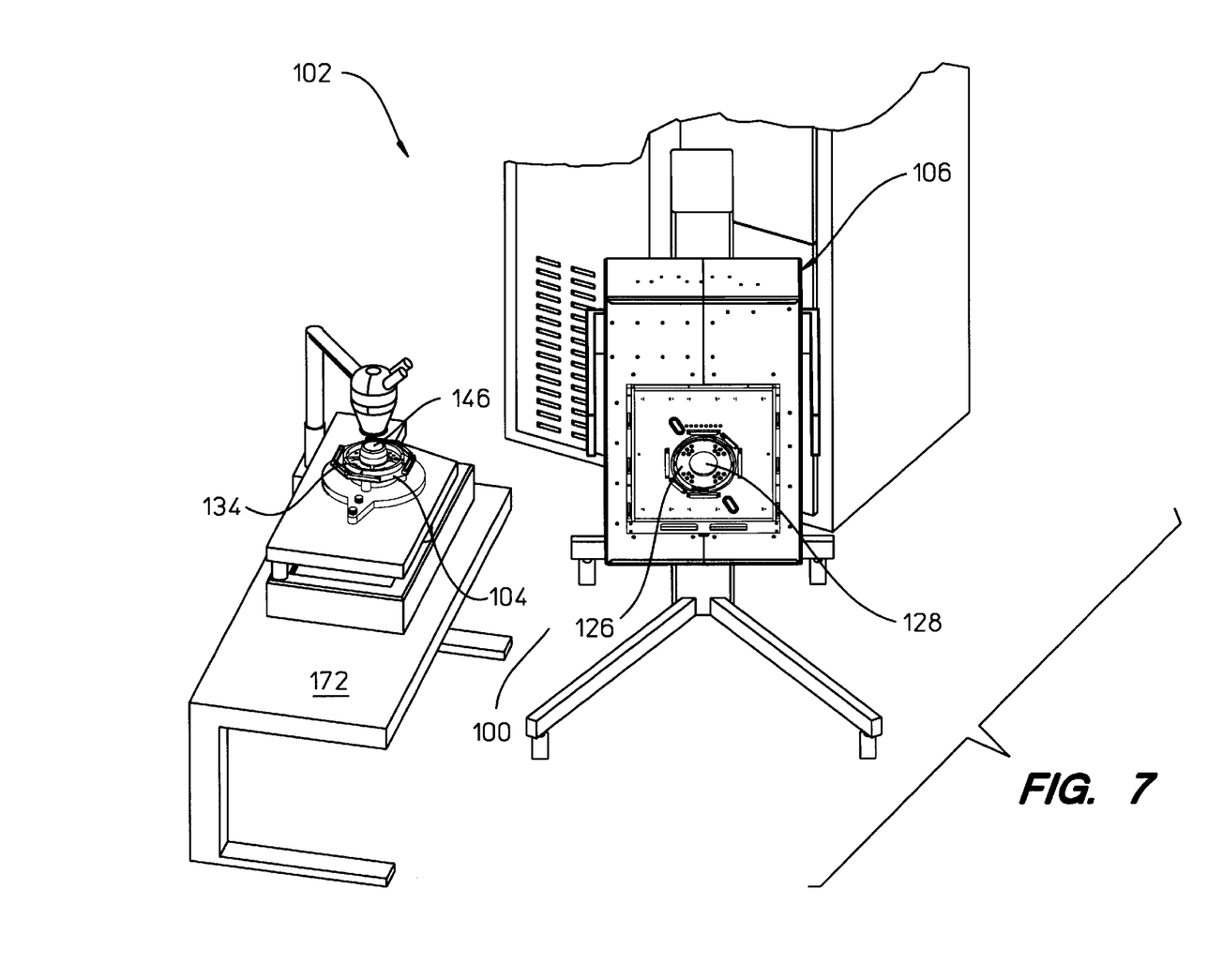
FIG. 7 illustrates deployment of a docking system at a wafer probing station to test devices or integrated circuits on wafer.

A docking system, generally indicated by the numeral 100 in FIGS. 2, 6, and 7, is provided in an electronic circuit test system 102 for interconnecting a fixture board 104 of the test system to a test head 106 of the test system. As shown in FIG. 2, a device-under-test (DUT) board 108 is incorporated into the fixture board 104. Also, a socket 110 is incorporated into the DUT board 108 for contacting leads of a packaged device or integrated circuit (not shown) during actual testing and connecting the leads to the DUT board.

Figure 3:
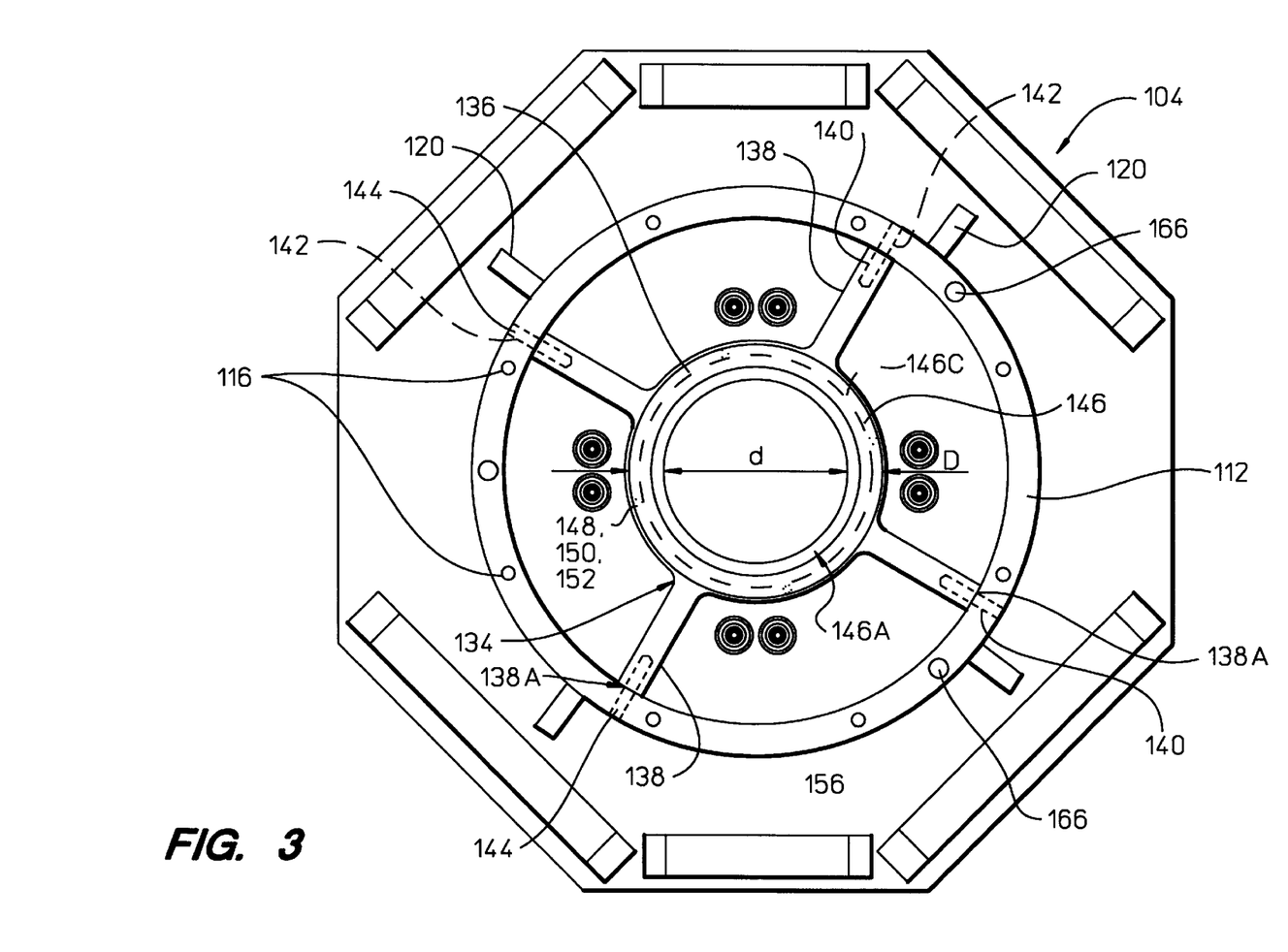
FIG. 3 is a detail of a docking cone and spider comprising the docking system shown in FIG. 2.

As shown in FIGS. 2 and 3, the fixture board 104 comprises a pulldown ring 112 mounted to the fixture board. The fixture board 104 has a plurality of holes 114. The pulldown ring 112 has a plurality of threaded holes 116. A plurality of flathead screws 118 inserted through the holes 114 in the fixture board 104 and screwed into the threaded holes 116 in the pulldown ring 112 mounts the pulldown ring to the fixture board. The pulldown ring 112 preferably further comprises a plurality of pulldown pins 120 that extend radially outwardly from the periphery of the pulldown ring.

Figure 4:
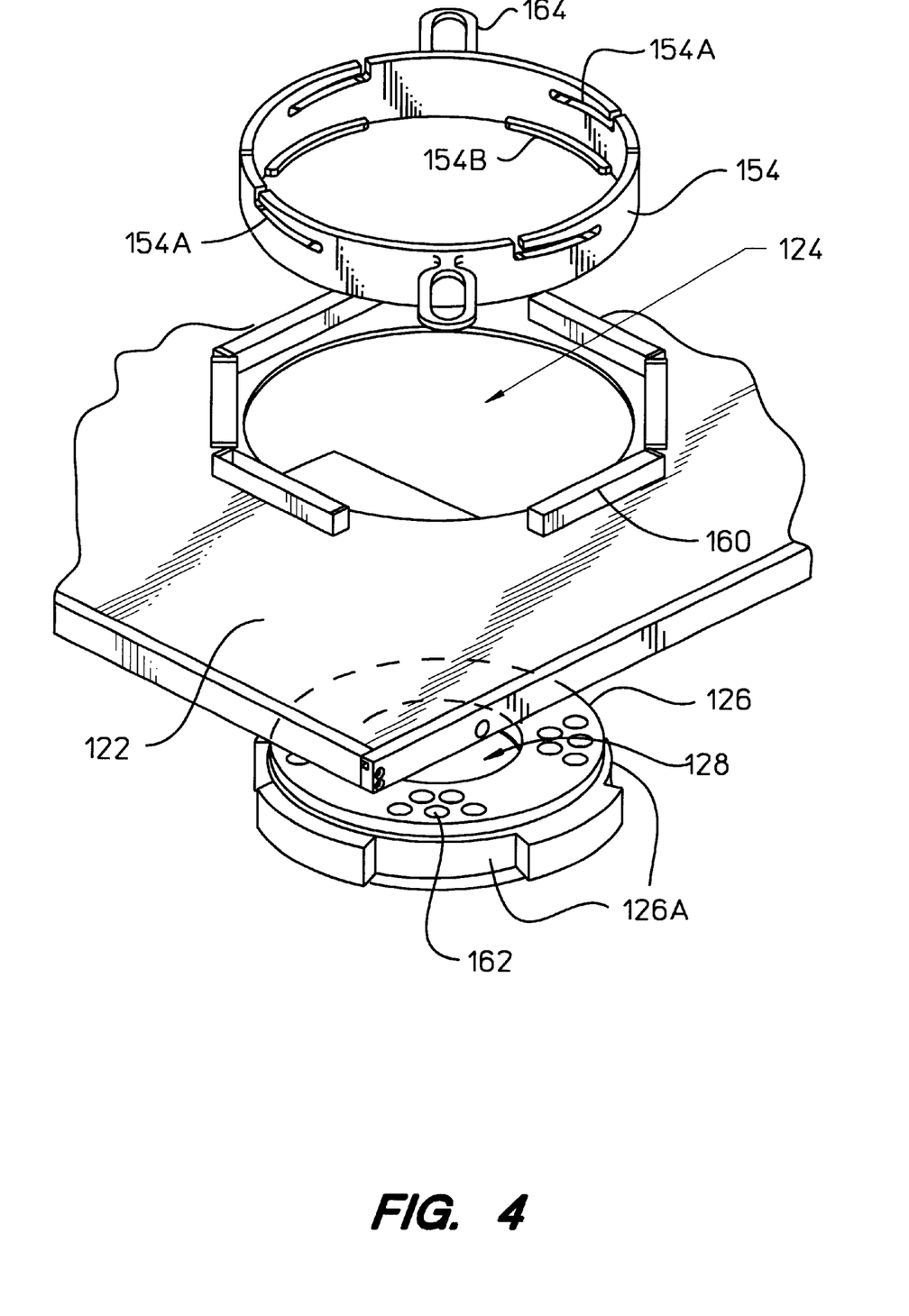
FIG. 4 is an exploded detail of the load board, a cam locking ring, and a connector support disk incorporated into the test head of the electronic circuit test system shown in FIG. 2.

As shown in FIG. 2, the test head 106 comprises a load board 122 selectively mounted to the test head and having an aperture 124. The test head 106 further comprises a connector support disk 126 mounted to the test head within the aperture 124. The test head 106 further comprises a connector support disk 126 mounted to the test head within the aperture 124. The connector support disk 126 has a plurality of peripheral notches 126A, as shown in FIG. 4. The connector support disk 126 also has an opening 128. As shown in FIG. 2, the connector support disk 126 is peripherally mounted with respect to a tunnel 130 through the test head 106, and the opening 128 of the connector support disk is aligned with the tunnel.

Figure 5:
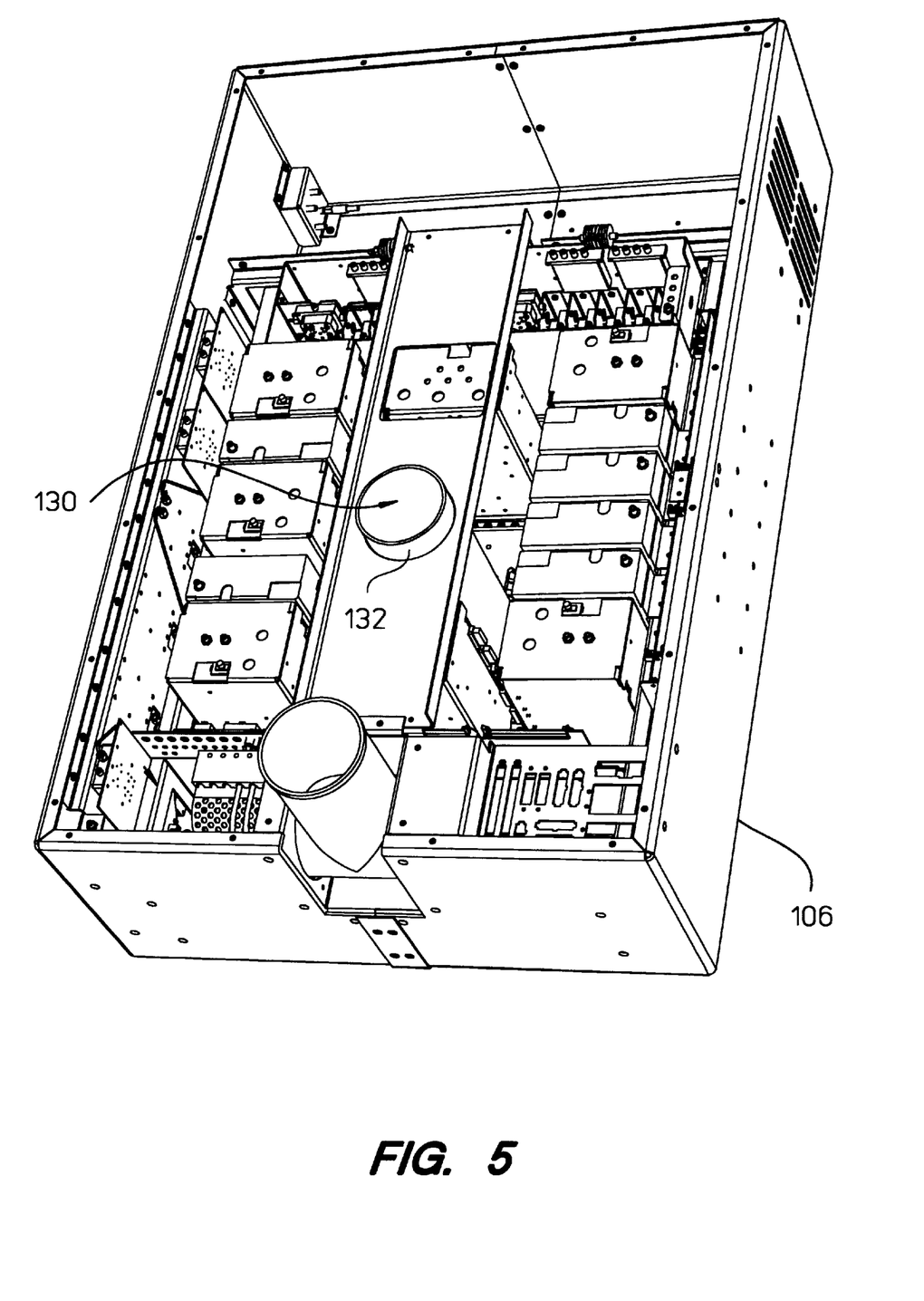
FIG. 5 is an isometric view of the obverse of the test head shown in FIG. 2.

As shown in FIGS. 2 and 5, the tunnel 130 extends entirely through the test head 106. In one implementation, the tunnel 130 can consist of a tube 132 that extends from the opening 128 in the connector support disk 126 through the back of the test head 106. The tunnel 130 enables an operator stationed behind the test head 106 to view through the test head from the rear of the test head.

Referring again to FIGS. 2 and 3, the docking system 100 comprises a spider 134 connected to the pulldown ring 112 of the fixture board 104. The spider 134 can be constructed from aluminum, for example. The spider 134 comprises an annulus 136 having a plurality of radial spokes 138. Each spoke 138 has an end 138A distal from the annulus 136. The distal end 138A of each spoke 138 has a threaded hole 140. The pulldown ring 112 has a plurality of holes 142 for alignment with the spokes 138 of the spider 134. A plurality of screws 144 inserted through the holes 142 in the pulldown ring 112 and screwed into the threaded holes 140 in the distal ends 138A of the spokes 138 of the spider 134 mounts the spider to the pulldown ring. As indicated by the arrow in FIG. 6, the face of each spoke 138 of the spider 134 opposite the fixture board 104 is preferably relieved intermediate the annulus 136 and the distal end 138A to enable electrical components to be mounted to the fixture board between the fixture board and the spider.

As shown in FIGS. 2 and 3, the docking system 100 also comprises male docking means preferably in the form of a docking cone 146 having a first end 146A and a second end 146B. The docking cone 146 can be constructed from Delrin, for example. The second end 146B of the docking cone 146 is mounted to the spider 134. In one implementation, the second end 146B of the docking cone 146 has a shoulder 146C so that the second end of the docking cone interfits into the annulus 136. Additionally, the annulus 136 has a plurality of holes 148 through the annulus. The second end 146B of the docking cone 146 has a plurality of threaded holes 150. A plurality of screws 152 inserted through the holes 148 in the annulus 136 and screwed into the threaded holes 150 in the second end 146B of the docking cone 146 mounts the docking cone to the spider 134.

As shown in FIG. 2, the first end 146A of the docking cone 146 is configured to interfit in female docking means preferably in the form of the opening 128 in the connector support disk 126 and the tunnel 130 in the test head 106 when the fixture board 104 is moved toward the test head. In one implementation, as shown in FIGS. 2, 3, and 4, the opening 128 in the connector support disk 126 is circular, and the docking cone 146 has a circular cross-section. The first end 146A of the docking cone 146 is tapered outwardly toward the second end 146B of the docking cone 146 has a first diameter d, and the second end 146B of the docking cone has second diameter D. The first diameter d is less than the second diameter D, and the second diameter is slightly less than the diameter of the opening 128 in the connector support disk 126.

In operation, the docking system 100 facilitates engagement of the fixture board 104 with the test head 106. As the fixture board 104 is moved toward the test head 106, the first end 146A of the docking cone 146 enters the opening 128 in the connector support disk 126. Since the docking cone 146 is tapered outwardly from the first end 146A to the second end 146B, the docking cone is self-centering with respect to the opening 128. As the fixture board 104 continues to move toward the test head 106, the first end 146A of the docking cone 146 proceeds into the tunnel 130 in the test head 106. Since the docking cone 146 is self-centering within the opening 128 of the connector support disk 126, the second end 146B of the docking cone is guided into the opening in the connector support disk and seats within the opening in the connector support disk.

Additionally, as shown in FIGS. 2 and 4, in order to install the fixture board 104 having the DUT board 108 with the socket 110 on the test head 106, the test head preferably comprises a cam ring 154 for selectively engaging the pulldown ring 112 on the fixture board and the connector support disk 126 and actuable to interconnect the fixture board to the test head. The cam ring 154 has a plurality of bayonet slots 154A. The pulldown pins 120 of the pulldown ring 112 mounted to the fixture board 104 engage in the bayonet slots 154A of the cam ring 154. The cam ring 154 also has a plurality of tabs 154B that pass through the notches 126A of the connector support disk 126 when the cam ring is mounted to the test head 106.

As the fixture board 104 is moved toward the test head 106 and the docking cone 146 enters the opening 128 in the connector support disk 126 and the tunnel 130 in the test head, the pulldown pins 120 on the pulldown ring 112 are guided toward the bayonet slots 154A of the cam ring 154. When the pulldown pins 120 of the pulldown ring 112 are lodged in the bayonet slots 134A of the cam ring 145, rotation of the cam ring causes axial movement of connectors 156 and 158 mounted to the fixture board 104 toward mating connectors 160 and 162 mounted to the load board 122 and the connector support disk 126, respectively, for effecting electrical connection between the socket 110 and the test head 106. Also, as the cam ring 154 is rotated, the tabs 154B rotate away from the notches 126A and are captured beneath the periphery of the connector support disk 126, whereby a gun breech connection is formed. The cam ring 154 preferably comprises at least one handle 164 on the periphery of the cam ring which can be grasped by the operator to rotate the cam ring.

As shown in FIGS. 2 and 3, the pulldown ring 112 further comprises a plurality of holes 166. Additionally, the connector support disk 126 comprises a plurality of tapered dowel pins 168 that interfit in respective holes 166 in the pulldown ring 112 as the docking cone 146 guides the fixture board 104 toward the test head 106. Consequently, the docking cone 146 provides gross alignment of the fixture board 104 with respect to the load board 122 and the connector support disk 126, and the tapered dowel pins 168 provide precise alignment so that the connectors 156 and 158 mounted to the fixture board mate with connectors 160 and 162 mounted to the load board 122 and the connector support disk 126, respectively, for effecting electrical connection between the socket 110 and the test head 106. Mechanical connection between the fixture board 104 and the test head 106 is provided when the cam ring 154 is rotated due to engagement of the pulldown pins 120 of the pulldown ring 112 in the bayonet slots 154A of the cam ring, on the one hand, and the gun breech connection between the tabs 154B of the cam ring and the periphery of the connector support disk 126, on the other hand.

As shown in FIG. 6, the docking system 100 is configured to facilitate interfacing the electronic circuit test system 102 to an automated material handler which feeds packaged devices and integrated circuits to the test system. The fixture board 104 is attached to the output of an electronic circuit handler 170, such as a Daymarc 717 MonoRail integrated circuit handler, for feeding a packaged device or integrated circuit to the socket 110. As shown in FIGS. 3 and 7, the docking system 100 is configured to facilitate interfacing the electronic circuit test system 102 to a wafer probing station 172 which probes devices or integrated circuits on wafer.

The docking system 100 provides repeatable interconnection of the fixture board 104 to the test head 106. The docking system 100 also minimizes the risk of damage to the connectors 156 and 158 mounted to the fixture board 104 and the respective connectors 160 mounted to the load board 122 and the connectors 162 mounted to the connector support disk 126, as well as reduces the risk of damaging the tapered dowel pins 168.

The docking system 100 is susceptible to various modifications, changes, and adaptations. For example, the DUT board 108 can be integrated into the fixture board 104, rather than comprising a separate element incorporated into the fixture board. Additionally, the arrangement of structure corresponding to the docking cone 146 and spider 134 and structure corresponding to the opening 128 can be switched such that the docking cone and spider are mounted to the test head 106 and a receiving aperture is formed on the fixture board 104 which faces the test head. Alternatively, an inwardly tapered lip could be formed on the periphery of the connector disk 126 to correspond to the docking cone 146 and spider 134, and the tapered lip would be self-centering within the pulldown ring 112, that is, the interior of the pulldown ring would correspond to the opening 128.

Now that a general overview of a docking system has been described, the novel features of the preferred embodiments of the compliant wafer prober docking adapter according to the present invention will now be described.

In one embodiment, the compliant wafer prober docking adapter provides a compliant docking capability which permits a test head to be floated (to come down) to the top portion of the compliant adapter. The compliant adapter includes coiled springs which compliantly support a portion of the weight of the test head and wherein the upper plate of the adapter automatically aligns itself with the test head. This desirable aspect allows for all of the connectors to be seated properly, such that the locking of a cam portion provides a compliant and secure mating between the two surfaces. The compliant adapter includes flexible cables between the two top and bottom surfaces and, in one embodiment, the compliance between the two surfaces is approximately ¼–⁵⁄₁₆ inch in all directions.

Another feature of the present invention is in connection with the docking process. The present invention provides for clamping the compliant adapter to a wafer prober table. The compliant adapter includes a rotatable ring to which is affixed a prober card which contains prober tips. The rotatable ring is dropped into a recess on the wafer prober table and the adapter is clamped to the table. The rotatable ring provides for an angular or theta adjustment, which allows for internal rotation of the ring (which has a prober card with probe tips affixed to it) to allow for angular alignment of the probe tips to a wafer. In one embodiment, the present invention allows for angular rotation within approximately 15 degrees. The present invention allows for one user who can view the alignment process through a microscope (or television monitor) directly without the complexity and awkwardness of prior art approaches. When aligned, the head can then be lowered and locked in position and the system is ready to be tested.

Figure 8:
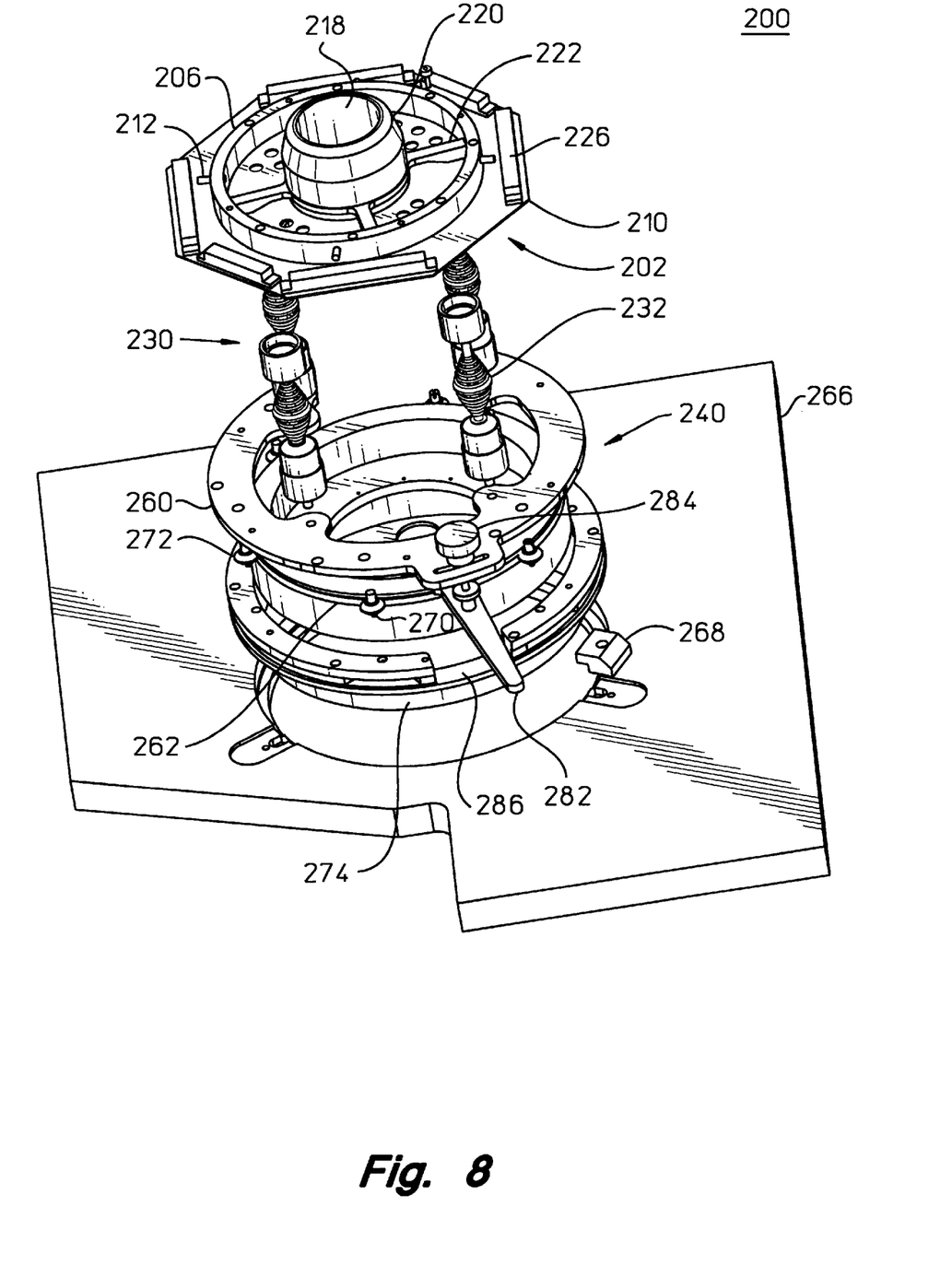
FIG. 8 shows an exploded, isometric view of the compliant wafer prober docking adapter according to the present invention.

Referring now to FIG. 8, an exploded isometric view of one embodiment of the compliant wafer prober docking adapter 200 according to the present invention is shown. The compliant adapter 200 in FIG. 8 is suitable for use with a docking system such as described in conjunction with FIGS. 1–7. The compliant adapter configuration 200 shown in FIG. 8 includes a fixture board arrangement 202 which is analogous to that described in FIG. 3. In FIG. 8 a pulldown ring 206 is oriented with the fixture board 210. The pulldown ring 206 has pulldown pins 212 which can be grasped by a quick connect cam mechanism on a head set (not shown in FIG. 8), as will be described. The fixture board arrangement 202 further includes an inverted docking cone 220 connected to a spider 222, which in turn is oriented to the fixture board 210 in a manner analogous to that arrangement shown in FIG. 3 above. The connectors 226 on fixture board 210 are also interconnected in a fashion analogous to the docking system described in FIGS. 1–7.

The compliant docking adapter 200 of FIG. 8 includes the inverted docking cone arrangement to facilitate the compliant docking features of the present invention, as will be described in more detail below.

Figure 9:
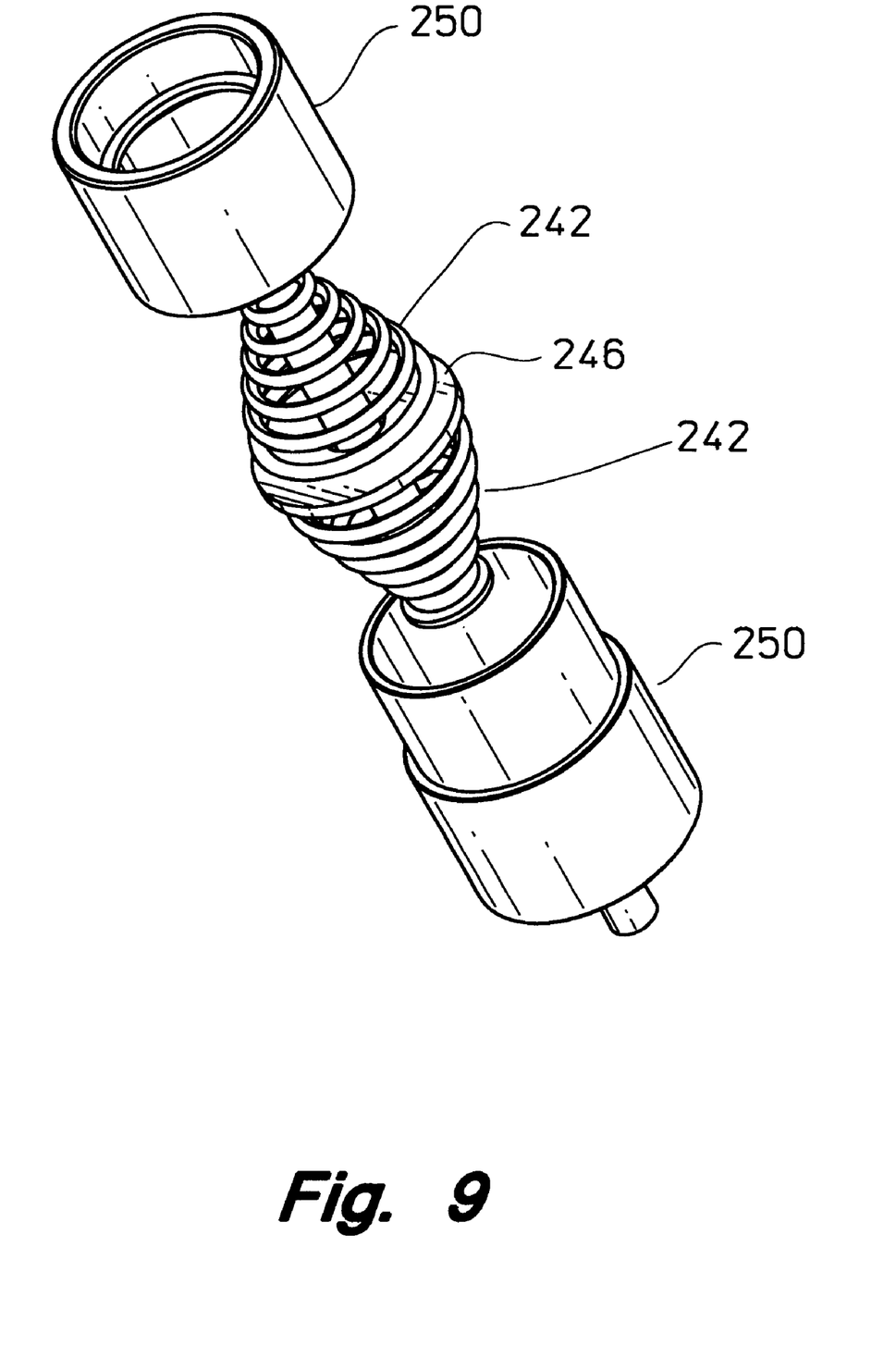
FIG. 9 shows an exploded, isometric view of a conical spring pair, which forms part of the compliant adapter of FIG. 8.

In FIG. 8, a compliant spring mechanism 230 includes a plurality of conical or tapered spring pairs 232 which are interconnected between the fixture board arrangement 202 and the rotatable locking assembly 240. In a preferred embodiment, there are four conical or tapered spring pairs 232 which compliantly interconnect the fixture board configuration 202 through the pulldown ring 206 and the locking assembly 240. As seen if FIG. 9, each spring pair 232 is formed of conical shaped springs 242 which are separated from one another by a washer 246. Each spring pair 232 is mounted between the fixture board configuration 202 and the locking assembly 240 via suitable locking means. Each spring pair 232 is housed within a housing assembly 250 (which could a threaded housing assembly), as shown in exploded form in FIG. 9. The compliant spring pairs 232 and housing assembly 250 provide, in one embodiment, a positive stop for a compliance range in all directions of approximately ¼–⁵⁄₁₆ inch. Other compliance ranges are of course possible with the compliant adapter 200.

Figure 10:
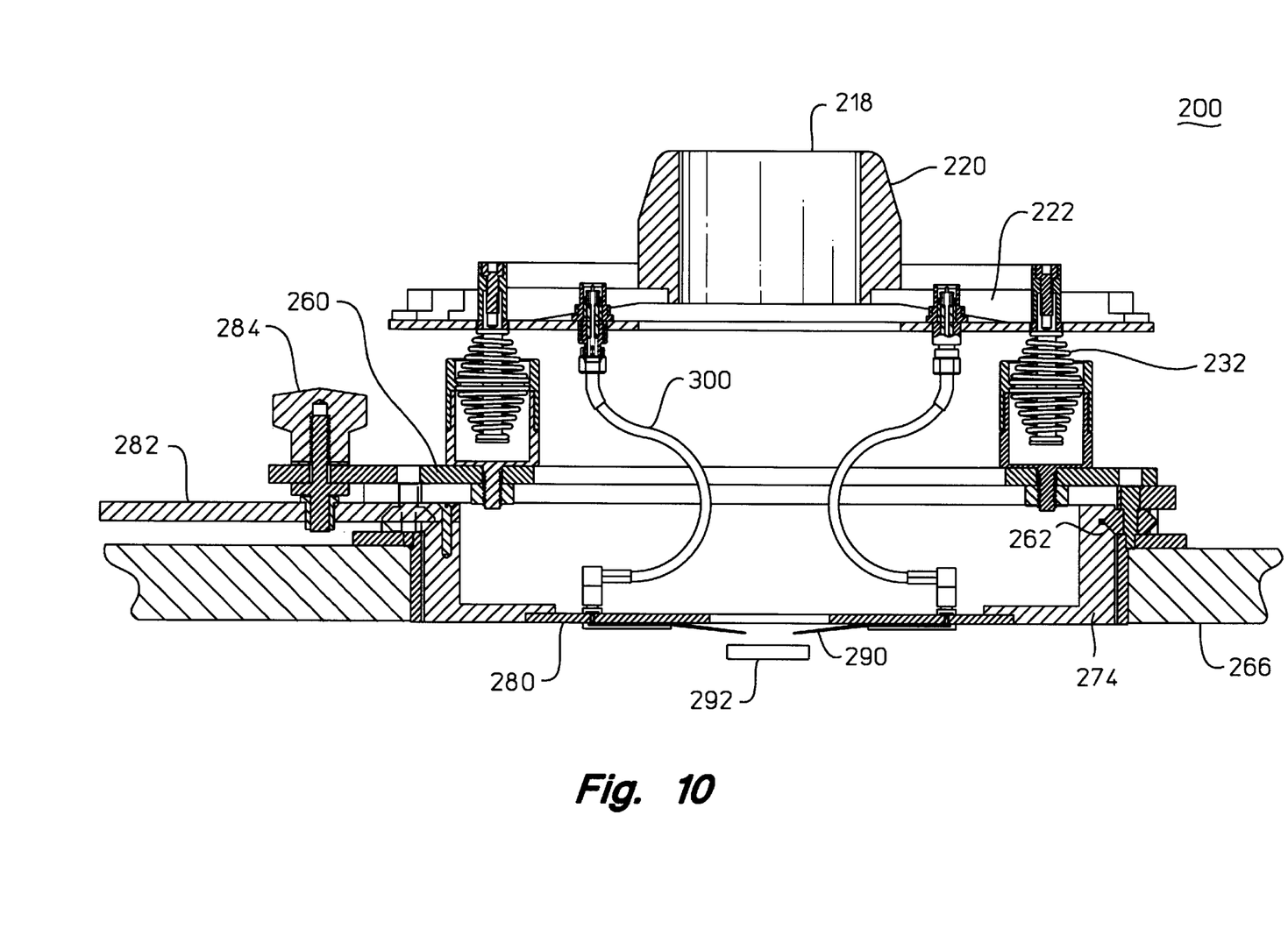
FIG. 10 shows a cross sectional view of the compliant adapter of FIG. 8.

Referring again to FIG. 8, the rotatable locking assembly 240 includes a locking plate 260 to which the bottom portion of each spring pair 232 is attached and a lower ring portion 262 which can be seated and clamped within the wafer prober table 266 in a conventional fashion, using clamps 268. The locking assembly 240 includes a ring portion 262 which, in one embodiment, has six V-shaped rollers 270, 272 (two fixed rollers 270 and four eccentric rollers 272). The V-shaped rollers 270, 272 engage an internal V-groove in probe card holder ring 274 which fits into the wafer prober table recess 266. This arrangement permits accurate angular rotation of an affixed prober card 280 (as seen in FIG. 10) by suitable movement of lever or handle 282, which can then be locked in position by use of lock 284. It has been found in one preferred embodiment that rotation of handle 282 within slot 286 to allow for an angular rotation of 15° provides sufficient angular adjustment of a prober card with probe tips for final alignment purposes in order to quickly and accurately provide an alignment of the docking system.

FIG. 10 shows a cross sectional view of the compliant wafer prober docking adapter 200 of FIG. 8. Although angular rotation if a prober card 280 contained within the locking assembly could be much higher (e.g., 180°), the 15° adjustment allows the ability for a user to accurately align the probe tips 290 of FIG. 10 to a wafer 292 (e.g., a substrate of a test board currently under evaluation). The combination of the fixed and eccentric rollers 270, 272 and a corresponding V-groove ring 274 within the wafer prober table 266 allows for smooth and accurate angular rotation-of the locking assembly 240, which can then be locked in position by use of lock 284.

In FIG. 10, the docking cone 220 is affixed to the spider 222 of FIG. 8 and fixture board 210 in a manner previously described. The tapered or conical spring pairs 232 (one pair can be seen in exploded view in FIG. 9) are interconnected between the fixture board arrangement 202 and locking assembly 240 of FIG. 8 in a similar manner. As also seen in FIG. 10, a pair of flexible electrical cables 300 are electrically interconnected in a known manner between the fixture board arrangement 202 and the prober card 280, and hence to the prober tips 290. The use of the flexible electrical cables 300 provides the necessary electrical interconnection between a test head and a test device 292. The present invention provides for a compliant wafer prober docking adapter 200 with desirable features and advantages which will now be described.

Figure 11:
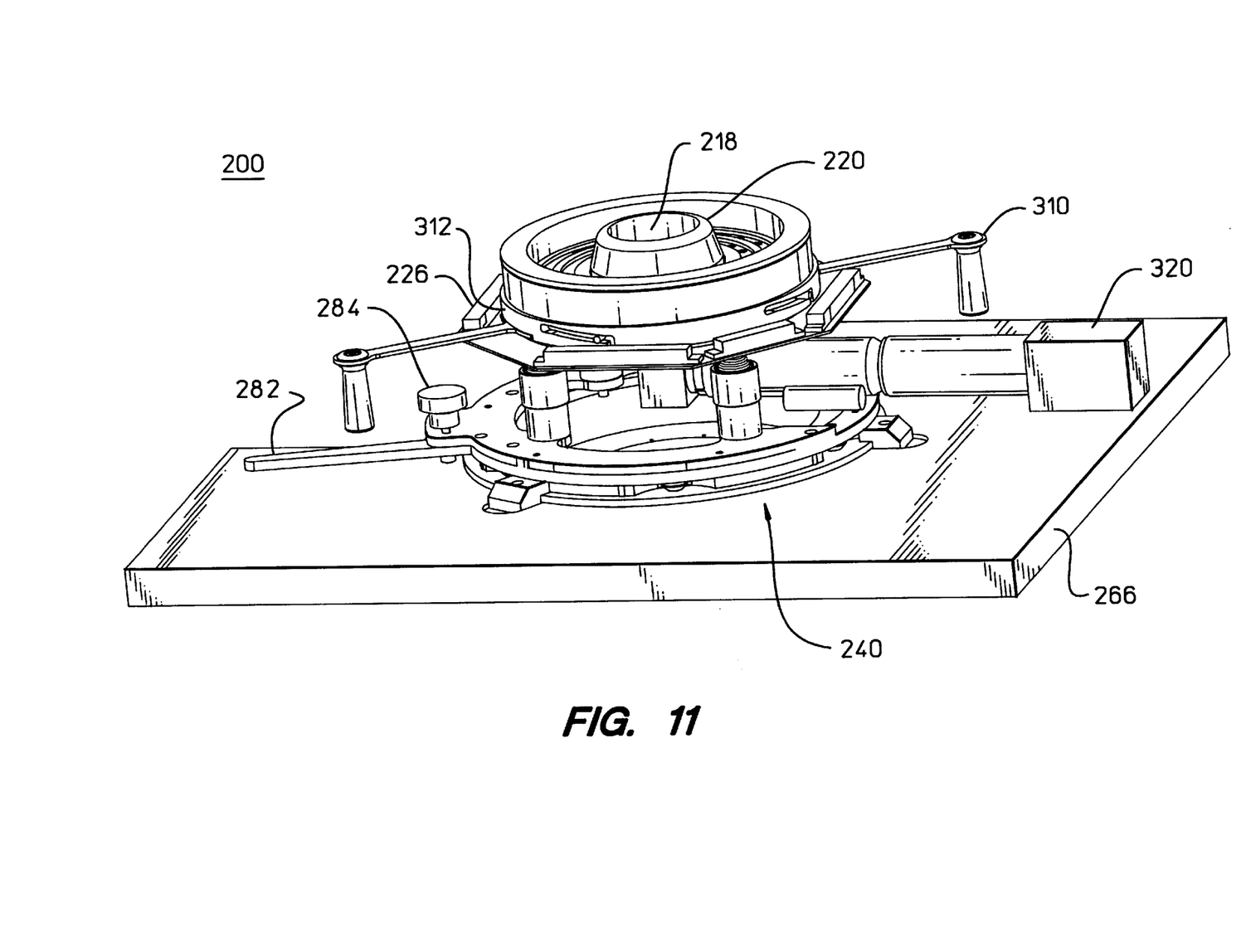
FIG. 11 shows another isometric view of the compliant wafer prober docking adapter attached to the top surface of a wafer prober according to the present invention.

FIG. 11 shows another perspective view of the compliant wafer prober docking adapter 200 in which a pair of locking arms 310, which when rotated by a user, serve to rotate the upper locking assembly 312 to engage and lock a test head (such as a test head 12 of FIG. 1). The inverted docking cone 220 serves to facilitate the initial engagement of a test head 12 of FIG. 1 to the fixture board arrangement 202 of FIG. 8.

The use of the compliant spring mechanism 230, including tapered or conical spring pairs 232 provides a number of desirable features according to the present invention. The spring pairs 232 compliantly adapt to the mass and rigidity of the test head itself The use of conical spring pairs 232 provides a compliant adapter capability by providing both tension and compression. It is preferable to provide an adaptive compliance in all directions of approximately ¼–5/16 inch.

As also seen in FIG. 11., a user could utilize a television camera 320, which when used with a prism (not shown), could provide an accurate display of the alignment process on a television monitor for greatly simplifying the docking process, as previously described above. The use of a television camera 320 would permit viewing the alignment process from the side of the compliant adapter. Alternatively, a microscope (not shown) could be utilized with the compliant wafer prober docking adapter 200 shown in FIG. 8, or a user could simply view the alignment process directly through the aperture 218 in the inverted docking cone 220.

Figure 12:
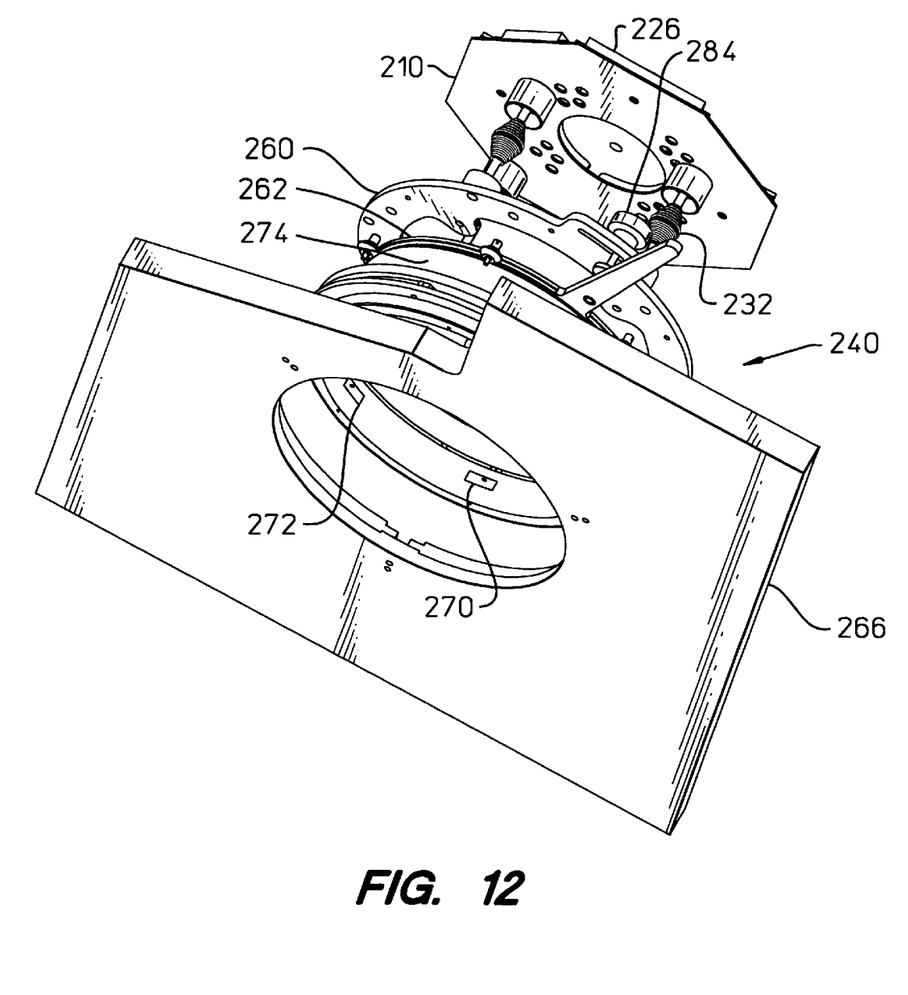
FIG. 12 shows bottom isometric view of the compliant wafer prober docking adapter according to the present invention.

FIG. 12 shows a bottom isometric view of the compliant wafer prober docking adapter 200 according to the present invention. In FIG. 12, it can be seem that the compliant adapter 200 can be seated within the recess within prober table 266. The fixed rollers 270 and eccentric rollers 272 engage a V-groove 262 in ring 274 so as to facilitate the angular rotation of locking assembly 240, as previously described.

In making the final adjustments with the compliant wafer prober docking adapter 200, a user can view the alignment of the prober tips 290 of FIG. 10 to the test board, such as with a television camera, microscope, or by directly viewing the alignment through the viewing aperture 218. As shown in FIG. 8, the handle 282 can be rotated and locked by lock 284 such that the angular rotation range is within the preferred embodiment of 15° (other ranges can be provided, as necessary). The locked position thus provides for a compliant adaptive capability which enables a single user to accurately and quickly align a docking system such as previously described.

In operation, the compliant wafer prober docking adapter 200 provides a compliant docking capability which permits a test head (such as test head 12 of FIG. 1) to be floated (to come down) to the top portion of the compliant adapter 200. The inverted docking cone 220 has the top or first end which is narrower than the second or bottom end (the bottom end is wider than the top end). This arrangement facilitates the initial docking process of the test head to the fixture board arrangement 202. The coiled spring pairs 232 compliantly support a portion of the weight of the test head and further the upper portion of the adapter 200 automatically aligns itself with the test head, as would be understood in viewing FIG. 11. This desirable aspect allows for all of the connectors 226 to be seated properly, such that the locking of a cam locking handle 310 provides a compliant and secure mating between the two surfaces. As described above, the compliant adapter 200 includes flexible cables 300 electrically interconnected in FIG. 10 between the two top and bottom surfaces and, in one embodiment, the compliance between the two surfaces is approximately ¼–5/16 inch in all directions.

Another feature of the present invention has been described in connection with the docking process. The present invention provides for angular adjustment of a prober card 280 shown in FIG. 10, which allows for angular alignment of the prober tips 290 to a wafer 292 within approximately 15 degrees (in one embodiment). The present invention allows for one user who can view the alignment process through a microscope 320 (or television monitor) without the complexity and awkwardness of prior art approaches.

In accordance with another feature of the present invention, test heads can be easily moved from one wafer prober to another, because the alignment of the adapter 200 to a wafer 292 is not being disturbed. Hence, test heads can be moved back and forth between stations very quickly without having to go through another long and complex re-alignment process.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. In a docking system for docking a prober card having probe tips to a wafer card on a wafer prober table, a wafer prober docking adapter comprising:

a fixture board arrangement, said fixture board arrangement including a fixture board, a pulldown ring, and a spider to form said fixture board arrangement,     a docking cone for facilitating the initial docking of a test head to said fixture board arrangement, said docking cone having a first end and a second, wider end affixed to said spider, a cam locking mechanism for locking said test head to said fixture board arrangement, a rotatable locking assembly clamped to said wafer prober table, said rotatable locking assembly including a rotatable ring carrying said prober card having said probe tips, said rotatable ring being locked into locking engagement when said probe tips are rotatably aligned with said wafer card, and a compliant spring mechanism interconnected between said fixture board arrangement and said locking assembly for compliantly adapting said locked test head and said fixture board arrangement with said locked rotatable ring carrying said prober card.

2. A docking system for docking a prober card having probe tips to a wafer card on a wafer prober table, said docking system comprising:

a wafer prober docking adapter, said adapter including a fixture board arrangement, said fixture board arrangement including a fixture board, a pulldown ring and a spider, a docking cone having a first end and a second, wider end affixed to said spider to form said fixture board arrangement, a rotatable locking assembly clamped to said wafer prober table, said rotatable locking assembly including a rotatable ring carrying said prober card having said probe tips, said rotatable ring being locked into locking engagement when said probe tips are rotatably aligned with said wafer card.

3. The docking adapter as in claim 2 wherein said docking system includes a test head and wherein said docking adapter includes a compliant spring mechanism interconnected between said fixture board arrangement and said locking assembly for compliantly locking said test head to said fixture board arrangement.

4. The docking adapter as in claim 3 wherein said docking cone facilitates the initial docking of said test head to said fixture board arrangement, said docking adapter including a cam locking mechanism for locking said test board to said fixture board arrangement.

5. The docking adapter as in claim 3 wherein said compliant spring mechanism includes a plurality of conical spring pairs.

6. The docking adapter as in claim 4 wherein said spring pairs are each enclosed in a housing to provide a positive stop for a predetermined range of compliance.

7. The docking adapter as in claim 6 wherein the range of compliance is approximately ¼ inch.

8. The docking adapter as in claim 5 wherein said locking assembly includes a plate for interconnecting to one end of said spring pairs, a handle for rotating said locking ring into said aligned position, and a locking mechanism for locking said ring in said locked position.

9. The docking adapter as in claim 8 including a plurality of flexible electrical cables for electrically interconnecting said fixture board arrangement to said prober card.

10. The docking adapter as in claim 9 including a television camera arrangement to permit viewing of the alignment of said probe tips to said wafer card.

11. The docking adapter as in claim 9 including a microscope arrangement to permit viewing of the alignment of said probe tips to said wafer card.

* * * * *